United States Patent
McDaniel

(10) Patent No.: US 9,780,749 B2
(45) Date of Patent: Oct. 3, 2017

(54) RADIO MUTE STRATEGY FOR NON-CAN RADIOS USED WITH SMART STARTING SYSTEMS

(71) Applicant: FORD GLOBAL TECHNOLOGIES, LLC, Dearborn, MI (US)

(72) Inventor: Jerry Wayne McDaniel, Melvindale, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 442 days.

(21) Appl. No.: 13/847,579

(22) Filed: Mar. 20, 2013

(65) Prior Publication Data

US 2014/0286503 A1    Sep. 25, 2014

(51) Int. Cl.
*H03G 3/20*    (2006.01)
*H03G 3/34*    (2006.01)

(52) U.S. Cl.
CPC ............ *H03G 3/20* (2013.01); *H03G 3/348* (2013.01)

(58) Field of Classification Search
CPC .................... H03G 3/20; H03G 3/348
See application file for complete search history.

(56) References Cited

U.S. PATENT DOCUMENTS

| | | | | |
|---|---|---|---|---|
| 4,441,086 A * | 4/1984 | Karlow et al. | ................ | 381/86 |
| 6,481,404 B1 * | 11/2002 | Perry et al. | ................ | 123/179.3 |
| 2008/0319593 A1 * | 12/2008 | Bhardwaj | ............ | F02N 11/0866 701/19 |
| 2009/0121555 A1 * | 5/2009 | Augustyn | ............ | H02M 3/155 307/130 |

FOREIGN PATENT DOCUMENTS

CA    2117602 A1    9/1993

\* cited by examiner

*Primary Examiner* — Ping Lee
(74) *Attorney, Agent, or Firm* — Frank MacKenzie Brooks Kushman, P.C.

(57) ABSTRACT

A radio module may be configured to receive a starter motor relay signal from a first control module indicative of a motor start. The module may in turn mute a sound device associated with the radio module and upon receiving a delayed accessory signal from a second control module indicative of a delayed accessory trigger, un-mute the sound device in response to receiving the delayed accessory signal.

16 Claims, 3 Drawing Sheets

RADIO MUTE STRATEGY FOR NON-CAN RADIOS USED WITH SMART STARTING SYSTEMS

BACKGROUND

During traditional vehicle start methods, an ignition switch may transmit a signal to a starter motor and the starter motor may begin to crank the engine. Upon cranking of the engine, power supplied to other vehicle components may be temporarily suspended. Additionally, some traditional radio systems may be muted during the vehicle start to avoid unpleasant and interfering noises being emitted through the radio speakers. Once the vehicle has been started, the radio may resume normal operations.

SUMMARY

A system may include a radio module configured to receive a starter motor relay signal from a first control module indicative of an engine start request, mute a sound device associated with the radio module, receive a delayed accessory signal from a second control module indicative of a delayed accessory trigger, and un-mute the sound device in response to receiving the delayed accessory signal.

A method may include receiving a starter motor relay signal, at a computing device, from a first control module indicative of an engine start request, muting a sound device associated with the radio module, receiving a delayed accessory signal from a second control module indicative of a delayed accessory trigger, and un-muting the sound device in response to receiving the delayed accessory signal.

A non-transitory computer readable medium tangibly embodying computer-executable instructions may include receiving a starter motor relay signal, at a computing device, from a first control module indicative of an engine start request, muting a sound device associated with the radio module, receiving a delayed accessory signal from a second control module indicative of a delayed accessory trigger, and un-muting the sound device in response to receiving the delayed accessory signal.

DETAILED DESCRIPTION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Figure 1:
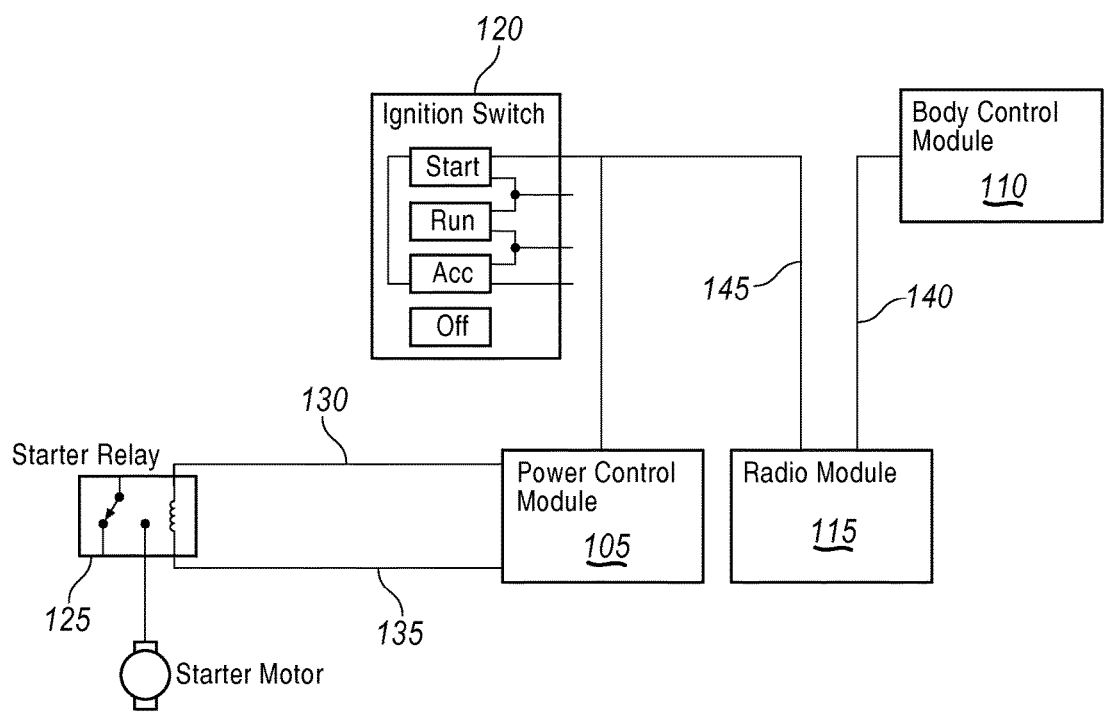
FIG. 1 is an exemplary schematic diagram of a radio mute system.

FIG. 1 is an exemplary schematic view of a radio mute system 100. The system 100 may include a powertrain control module (PCM) 105, a body control module (BCM) 110, a radio module 115, an ignition switch 120, and a starter relay 125. The components may be in communication with each other via several interfaces, as described below. The interfaces may include a wire, or other communication mechanism. The interface may include an input/output system configured to transmit and receive data between components, such The ignition switch 120 may an electrical switch configured to send a signal to a starter motor via the PCM 105 to start a vehicle. For example the ignition switch 120 may be switched in response to the turn of a key in an ignition or a push of a button in a push-button start system. The PCM 105 may be an electronic control until configured to control several components within a vehicle. One such component may be the starter relay 125. The starter relay 125 may be a starter solenoid capable of relaying a large electric current to the starter motor in order to start the engine of a vehicle. The electrical current may be received from the vehicle battery in addition to an electric current being received from the ignition switch 120 via the PCM 105.

Upon receiving the electrical current from the ignition switch 120 via the starter motor request signal (SMR) 145, a starter motor control signal (SMCS) may be sent at a high side driver 130 of the PCM 105 to the starter motor relay 125 to prepare to ignite the starter motor. The SMR signal may be sent to the PCM 105 to verify that all conditions are in place to start the vehicle. In one example, if the vehicle is not in the correct gear, e.g., the vehicle is not in park, the vehicle may not start. If, however, all conditions are met, a low side driver 135 of the PCM 105 may be configured to start the vehicle. The low side driver 135 may control the cranking of the engine by pulling the relay switch 125. Once the motor has been started, the low side driver 135 may release the relay switch 125.

Generally, starting the engine may also be referred to as "cranking" the engine. During cranking, the engine may require a large current from the car battery to start the motor. Because of this, other systems drawing on the battery may be temporarily turned off. Additionally, cranking the engine may cause for interference with other system components, such as the radio. For example, cranking, due to the large current required, may result in interference with the radio frequencies. Additionally, the cranking of the engine may result in noise being transmitted through a radio output, such as speakers. Thus, when a driver starts a vehicle, it may be necessary to mute the radio in order to avoid erroneous and unpleasant noises from emitting from the speakers. This process is described in more detail below.

The PCM 105 may be in communication with the BCM 110 via an interface (not shown). The BCM 110 may be an electronic control unit capable of monitoring and controlling various components within a vehicle. Such components may include a vehicle's power windows, mirrors, temperature controls, etc. The BCM 110 may also control other components such as relays, including a delayed accessory relay. Other relays may include door lock relays and overhead light relays. The delayed accessory relay may allow power to be applied to a circuit after an engine's ignition is turned off. For example, a delayed accessory relay may provide power to the radio module 115 after the engine has been turned off, but as long as a vehicle door has not been opened.

Similarly, a vehicle's dome lights may be illuminated upon engine shut off and stay lit for a predetermined amount of time. The delayed accessory relay may supply twelve volts (+12V) to the respective vehicle module until a predefined condition is met (e.g., door opens, time-out, etc.) In the radio module example, power to the radio output may be supplied until a door opens. Relays such as single pole double throw (SPDT) relays may be used. Other relays may also be used to provide power to the radio module.

The radio module 115 may be in communication with PCM 105 via an SMR interface 145. For example, the radio module 115 may be configured to receive indications over an SMR interface 145 that a starter motor request has been transmitted from the ignition switch 120 to the PCM 105. As shown in FIG. 1, the SMR interface 145 may be in communication with the PCM 105 and the radio module 115. The radio module 115 may also be in communication with the BCM 110 via a delayed accessory interface 140. The delayed accessory interface 140 may indicate when power to the delayed accessory has been dropped, thus causing the delayed accessory to temporarily suspend.

The radio module 115 may be a radio controller such as an audio head unit (AHU) and/or a digital signal processor (DSP) amplifiers. The radio module 115 may be in communication with a sound device. The sound device may be a form of radio output, such as speakers, within the vehicle. The radio module 115 may include an interior or exterior antenna and process and convert sound information, such as radio frequencies, into electrical signals to be sent to the radio output, e.g., speakers. The radio module 115 may also include a compact disc player, as well as be configured to connect to an mp3 device. The radio module 115 may also be capable of providing and/or controlling power to the speakers. The radio module 115 may also include an amplifier to increase the quality and overall volume of sound from the speakers.

Some vehicle radios may be controller area network (CAN) capable radios. These CAN radios may use DSP amplifiers to mute the radio during engine cranking Other, lower end radios, may not have CAN capabilities. These non-CAN radios rely on hardwired circuit designs to mute the radio module 115 during engine cranking. In one example, a radio may be hardwired to the high side driver 130 of the PCM 105. The radio may in turn detect when an engine is to be cranked based on a signal at the high side driver 130. However, the high side driver 130 may be considered a critical signal. Tapping into such a critical signal could affect the operations of the PCM 105 or cause an unintended crank of the engine. For example, in hardwiring components to the PCM 105, a failure in the component could result in a failed starting system. Thus, as shown in FIG. 1, by configuring the radio module 115 to receive an SMR signal via interface 145, it may be determined that an engine is cranking without any hardwiring into the PCM drivers 130, 135.

The radio module 115 may be configured to receive signals from both the BCM 110 and PCM 105. These signals may be used to mute the speakers at appropriate times. This process is described below with respect to the timing diagrams in FIG. 2. In general, a radio module 115 may mute the speakers during engine cranking and un-mute the speakers when the cranking is complete. These mute and un-mute triggers are based on a signal from the PCM 105 indicating that the motor is about to start, and a delayed accessory signal from the body control module at the interface 140 indicating that the motor has completed cranking.

Figure 2A:
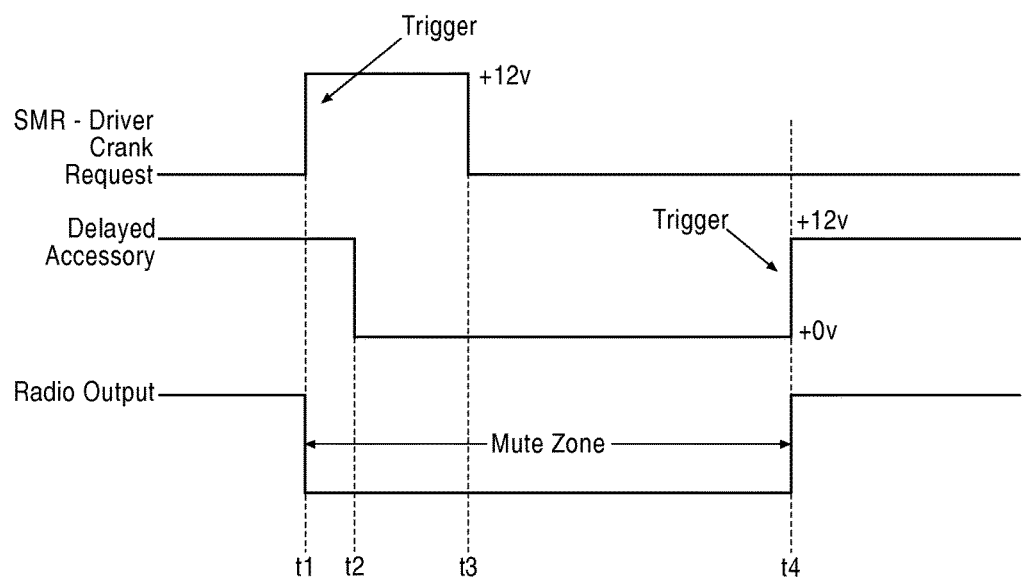
FIG. 2a is an exemplary timing diagram of the radio mute system.
Figure 2B:
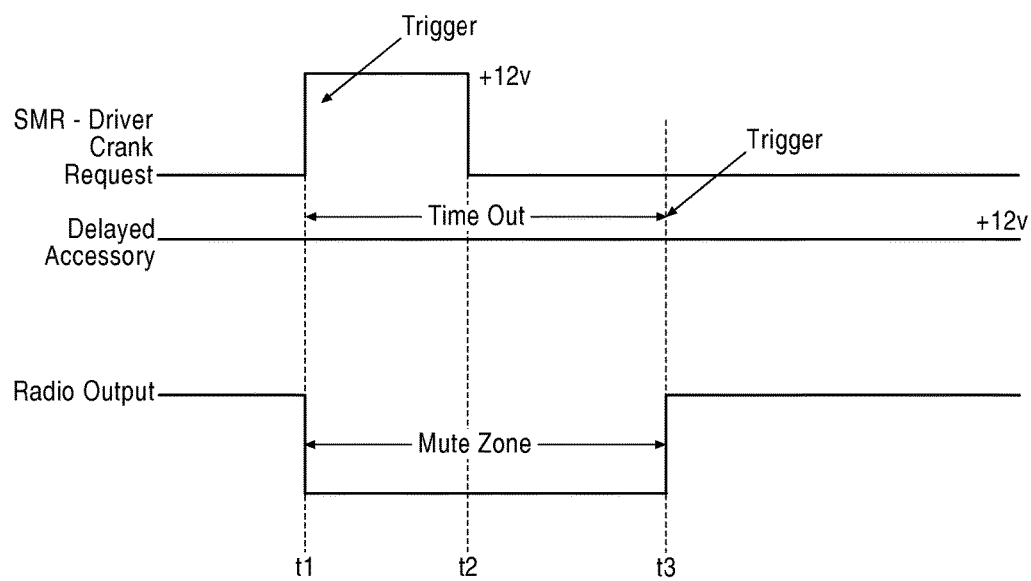
FIG. 2b is another exemplary timing diagram of the radio mute system.

In referring to FIGS. 2A and 2B, exemplary timing diagrams are shown showing the SMR signal, delayed accessory signal, and radio output over time. In FIG. 2A, an exemplary timing diagram is shown when the vehicle is started under normal conditions. That is, all of the conditions for a vehicle to start are met (e.g., the vehicle is in the correct gear.) At $t_1$, the ignition switch 120 may send a signal to the PCM 105 to start the engine. The radio module 115 may receive the SMR signal from the ignition switch 120 and determine that the engine is about to begin to crank. This indication may include a voltage of +12V. In response to detecting the indication, the radio module 115 may communicate with the radio output that the radio output should mute, that is, not emit any sound. At $t_1$, the delayed accessory signal may be carrying twelve volts (+12 v). At $t_2$, however, the delayed accessory power may drop while the engine in cranking. This may be done upon the BCM 110 receiving a notification from the PCM 105 that the engine is cranking. While the delayed accessory signal may itself indicate that the engine is cranking, this signal is delayed, and may not act as an effective trigger to mute the radio output. At $t_3$, the SMR signal may indicate that the motor has complete cranking Note, SMR allows the mute to happen prior to engine crank so that no noise is transmitted over the audio speakers. Waiting for the delayed accessory you will get a brief time overlap and popping noise may be heard over the speakers.

At $t_4$, in response to the cranking being completed, the delayed accessory signal may return to a +12 v signal. This change in voltage may act as a trigger for the radio module 115 to un-mute the radio output. Accordingly, FIG. 2A shows a timing diagram wherein a radio output is muted in response to an indication on the SMR signal that an engine is about to crank, and un-muted in response to an indication on the delayed accessory signal that the motor has been started.

In FIG. 2B, an exemplary timing diagram is shown when the PCM 105 has received a starter motor relay request but because some conditions are not met, the vehicle will not start (e.g., the vehicle is in the correct gear.) In this example, at $t_1$, an ignition switch 120 may send a signal to the PCM 105 at the high side driver 130 of the PCM 105. Because the SMR signal indicates a desire for the vehicle motor to start, the radio output may in turn be muted at $t_1$. However, the PCM 105 may determine that all of the conditions are not met for the vehicle motor to start. For example, the car may not be in park, but instead in another gear. Thus, because the engine never actually begins to crank, the delayed accessory signal may never be dropped. Unlike the situation shown in FIG. 2A, the reinstatement of the delayed accessory will not occur and thus cannot act as a trigger to un-mute the radio output. In this situation, the delayed accessory may include a predefined time-out response, wherein if the delayed accessory is not dropped within this predefined amount of time, the radio output will be un-muted. Thus, at $t_3$, the radio output is un-muted at least because there was no drop in the delayed accessory within the predefined time period and therefore the radio module 115 realizes that no engine cranking has occurred. This is an acceptable response from the customer perspective because they expect radio muting when they turn the ignition key to start.

Figure 3:
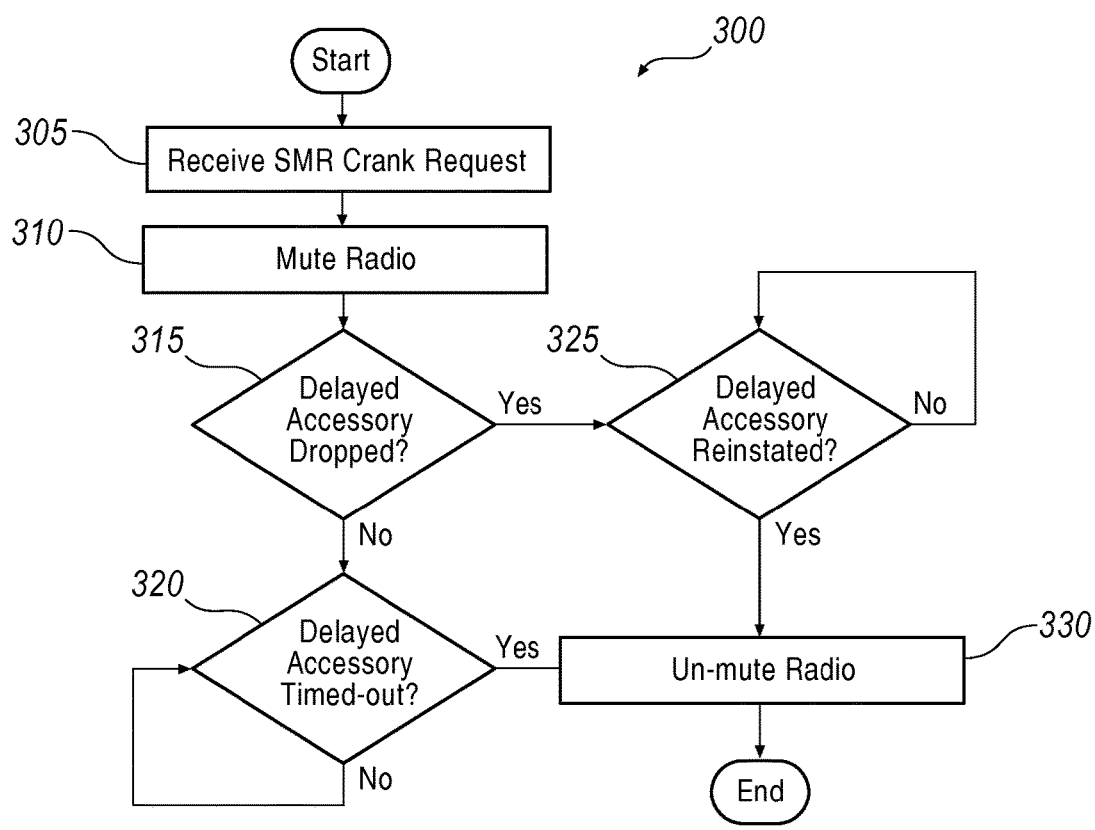
FIG. 3 is an exemplary flow chart for the radio mute system.

FIG. 3 is an exemplary process 300 of the radio mute system. The process begins at block 305 where the radio module 115 receives a starter motor relay signal. The signal may include a request from the ignition switch 120 to start the engine of the vehicle. As explained, and as shown above with respect to FIG. 2, the signal may include a voltage of +12V.

In block 310, the radio module 115 may mute the radio output in response to receiving a starter motor request. In order to mute the radio output, a signal may be transmitted to the radio output from the radio module 115. The signal may be sent via a wire, or it may be transmitted wirelessly. The radio module 115 may also be in communication with a vehicle control bus configured to provide an interface between the radio module 115 and the radio output. Once the radio output has been muted, the process proceeds to block 315.

In block 315, the radio module 115 determines whether the delayed accessory signal has been dropped. That is, whether the delayed accessory signal includes a voltage of +0V. If the delayed accessory has been dropped, the process 300 proceeds to block 325. If not, the block proceeds 300 block 320.

In block 320, the radio module 115 determines whether the delayed accessory has timed-out. That is, has the delayed accessory failed to drop for a predetermined amount of time. The predetermined amount of time may be pre-set within the radio module 115. In one example, if the delayed accessory has not dropped to +0V within 0.5 seconds of the starter motor request being received, the radio module 115 may determine that the engine was never started and therefore no cranking has occurred. This may be the situation if the vehicle conditions did not allow for a vehicle start, as is the example in FIG. 2B. If the delayed accessory signal has timed-out, the process 300 proceeds to block 330. If not, the process 300 may proceed to loop through block 320 until the time-out occurs.

In block 325, the radio module 115 determines whether the delayed accessory signal has been reinstated. That is, has the delayed accessory resumed to +12V. If so, the process 300 may proceed to block 330. If not, the process 300 may loop through block 325 until the delayed accessory is reinstated.

In block 330, the radio module 115 may communicate with the radio output to un-mute the radio output. This may be done in response to either: 1. the delayed accessory being reinstated, i.e., the engine cranking being completed, or 2. The delayed accessory signal being timed-out, i.e., the engine not being cranked due to conditions within the vehicle not being met.

Thus, a radio mute system is described and may include muting a radio output in response to an starter motor relay request being transmitted to the PCM, and un-muting the radio output in response to a delayed accessory trigger. By muting and un-muting a radio output based on these two signals, the need for a hard-wired mute design is removed and the critical signal at the drivers of the PCM are preserved.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

In general, computing systems and/or devices such as such as the controllers, biometric devices, displays telematics functions, etc., may employ any of a number of computer operating systems, including, but by no means limited to, versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OS X and iOS operating systems distributed by Apple Inc. of Cupertino, Calif., the BlackBerry OS distributed by Research In Motion of Waterloo, Canada, and the Android operating system developed by the Open Handset Alliance.

Computing devices, such as the controllers, biometric devices, displays telematics functions, etc., may generally include computer-executable instructions that may be executable by one or more processors. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor or microprocessor receives instructions, e.g., from a memory or a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computing device). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions on one or more computing devices, stored on computer readable media associated therewith. A computer program product may comprise such instructions stored on computer readable media for carrying out the functions described herein. In some examples, the application software products may be provided as software that when executed by processors of the devices and servers provides the operations described herein. Alternatively, the application software product may be provided as hardware or firmware, or combinations of software, hardware and/or firmware.

What is claimed as new and desired to be protected by Letters Patent of the United States is:

1. A system comprising:
   a powertrain control module, and
   a radio module configured to:
      receive a starter motor relay signal from the powertrain module indicative of an engine start request;
      mute a sound device associated with the radio module;
      receive a delayed accessory signal including an accessory time-out from a body control module indicating that a predefined time period has lapsed; and
      un-mute the sound device in response to receiving the delayed accessory signal.

2. The system of claim 1, wherein the delayed accessory signal includes a voltage increase.

3. The system of claim 2, wherein the voltage increase is twelve (12) volts.

4. The system of claim 1, wherein the accessory time-out is determined based on a predefined time-interval and the receipt of the starter motor relay signal.

5. The system of claim 1, wherein the starter motor relay signal includes a predefined voltage indicative of the engine start request.

6. A method comprising:
   receiving a starter motor relay signal, at a computing device, from a powertrain control module indicative of an engine start request;
   muting a sound device associated with a radio module;
   receiving a delayed accessory signal from a body control module indicating that a predefined time period has lapsed; and
   un-muting the sound device in response to receiving the delayed accessory signal.

7. The method of claim 6, wherein the delayed accessory signal includes a voltage increase.

8. The method of claim 7, wherein the voltage increase is approximately twelve (12) volts.

9. The method of claim 6, wherein the delayed accessory signal includes a delayed accessory time-out indicating that the predefined time period has lapsed.

10. The method of claim 9, wherein the accessory time-out is determined based on a predefined time-interval and the receipt of the starter motor relay signal.

11. The method of claim 6, wherein the starter motor relay signal includes a predefined voltage indicative of the engine start request.

12. A non-transitory computer readable medium tangibly embodying computer-executable instructions, comprising:
   receiving a starter motor relay signal, at a computing device, from a powertrain control module indicative of an engine start request;
   muting a sound device associated with a radio module;
   receiving a delayed accessory signal from a body control module indicating that a predefined time period has lapsed; and
   un-muting the sound device in response to receiving the delayed accessory signal.

13. The medium of claim 12, wherein the delayed accessory signal includes a voltage increase.

14. The medium of claim 12, wherein the delayed accessory signal includes a delayed accessory time-out indicating that the predefined time period has lapsed.

15. The medium of claim 14, wherein the accessory time-out is determined based on a predefined time-interval and the receipt of the starter motor relay signal.

16. The medium of claim 12, wherein the starter motor relay signal includes a predefined voltage indicative of the engine start request.

* * * * *